United States Patent
Preuthen et al.

(10) Patent No.: US 7,334,207 B2
(45) Date of Patent: Feb. 19, 2008

(54) AUTOMATIC PLACEMENT BASED ESD PROTECTION INSERTION

(75) Inventors: Herbert Johannes Preuthen, Dorfen (DE); Johann Leyrer, Munich (DE); Hermann Sauter, Munich (DE)

(73) Assignee: LSI Logic Corporation, Milpitas, CA (US)

( * ) Notice: Subject to any disclaimer, the term of this patent is extended or adjusted under 35 U.S.C. 154(b) by 316 days.

(21) Appl. No.: 11/140,896

(22) Filed: May 31, 2005

(65) Prior Publication Data

US 2006/0268486 A1 Nov. 30, 2006

(51) Int. Cl.
*G06F 17/50* (2006.01)

(52) U.S. Cl. ............................................. 716/10; 716/2

(58) Field of Classification Search .................... 719/2, 719/5, 6, 10–14; 716/2, 5, 6, 10–14
See application file for complete search history.

(56) References Cited

U.S. PATENT DOCUMENTS 5,969,929 A * 10/1999 Kleveland et al. .......... 361/111
5,984,510 A * 11/1999 Guruswamy et al. .......... 716/2
6,209,123 B1 * 3/2001 Maziasz et al. ............... 716/14
6,553,542 B2 * 4/2003 Ramaswamy et al. .......... 716/2
6,823,502 B2 * 11/2004 Wingren et al. ............... 716/9
7,103,862 B2 * 9/2006 Sung et al. ..................... 716/5
2006/0050453 A1 * 3/2006 Duvvury et al. .............. 361/56

* cited by examiner

*Primary Examiner*—Vuthe Siek
(74) *Attorney, Agent, or Firm*—Christopher P. Maiorana PC

(57) ABSTRACT

An apparatus comprising a plurality of input cells, two or more local tie up cells, and two or more local tie down cells. The plurality of input cells may be configured to provide (i) one or more gate voltage signals and (ii) one or more supply voltage signals. The two or more local tie up cells may be configured to provide electrostatic discharge (ESD) protection to one or more first standard cells. Each of the local tie up cells may be coupled to (i) the one or more first standard cells and (ii) each of the gate voltage signals. The two or more local tie down cells may be configured to provide ESD protection to one or more second standard cells. Each of the local tie down cells may be coupled to (i) the one or more second standard cells and (ii) each of the supply voltage signals.

17 Claims, 4 Drawing Sheets

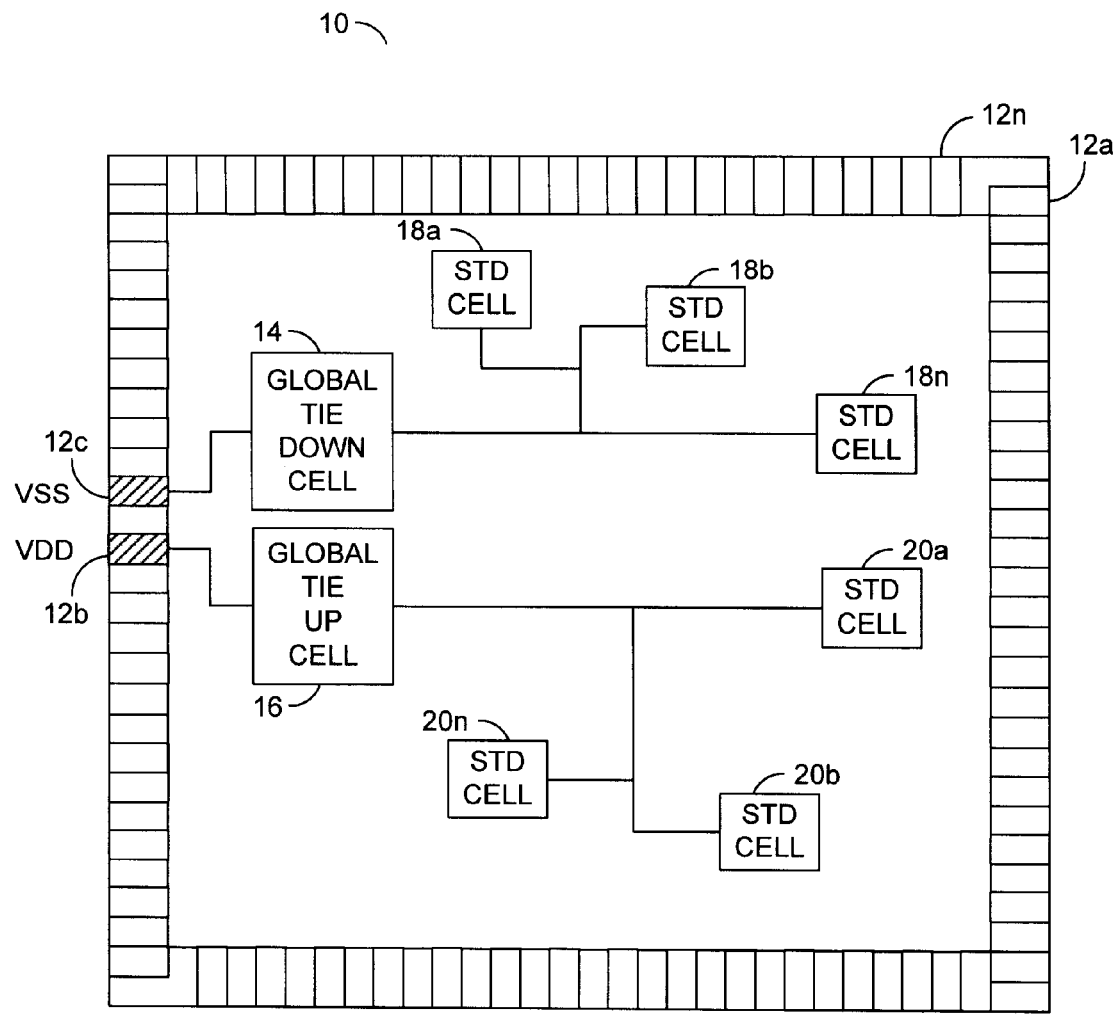
FIG. 1
(CONVENTIONAL)

AUTOMATIC PLACEMENT BASED ESD PROTECTION INSERTION

FIELD OF THE INVENTION

The present invention relates to electrostatic discharge (ESD) protection generally and, more particularly, to a method and/or apparatus for implementing automatic placement based ESD protection insertion.

BACKGROUND OF THE INVENTION

At the deep sub-micron level, such as 90 nm or 65 nm structures, the protection of transistor gates has become important. One example of a design rule in deep sub-micron technologies is that the gate voltage should not be larger than the supply voltage of a transistor. In an application specific integrated circuit (ASIC) design, thousands of gates and/or pins are each connected either to a static "logic one" or "logic zero" The gate and/or pins need to be connected to a voltage VDD or a voltage VSS. The voltage VDD or VSS is connected to the gate of the transistors. This approach is called "tie up" or "tie down" of a signal and/or gate.

Conventional tie up and tie down nets generally provide one of the largest contributions to high fanout "signal" nets in designs. In 90 nm or 65 nm technologies, design rules generally prohibit the voltage at a gate from being larger than the voltage for the supply of the transistor. With conventional methods, the gate input of the transistor is tied to the logic zero and/or the logic one. A cell power rail and/or a thick power rail is directly connected to the gate input of a transistor. The transistor is tied to the logic zero and/or logic one. Conventional approaches cannot assure that the gate input voltage of the transistor is lower than the voltage of the power supply.

Conventional approaches attempt to solve this issue by inserting an electrostatic discharge (ESD) buffer and/or decoupling buffer to avoid the direct connection of the logic gate to the VDD or VSS net. The inserted buffer is a global cell that connects global signals. The buffer is manually inserted in the netlist. The manual connection is made by the designer.

Referring to FIG. 1, a block diagram of a circuit 10 illustrating a conventional approach for connecting one or more standard cells is shown. The circuit 10 generally comprises a number of I/O cells 12a-12n, a global tie down cell 14, a global tie up cell 16, a number of standard cells 18a-18n, and a number of standard cells 20a-20n. The standard cells 18a-18n are coupled to the global tie down cell 14. The global tie down cell 14 is coupled to the I/O cell 12c. The voltage VSS is supplied to the I/O cell 12c. The standard cells 20a-20n are coupled to the global tie up cell 16. The global tie up cell 16 is coupled to the I/O cell 12b. The voltage VDD is supplied to the I/O cell 12b.

With the circuit 10, only one global tie up cell 14 and one global tie down cell 16 are implemented. The single global tie up cell 16 and the single global tie down cell 14 do not link to the real design. The global tie down cell 14 and tie up cell 16 generate interconnect signals that can be the root cause of many issues in the subsequent design flow. The global tie down cell 14 and tie up cell 16 can significantly hurt the design closure flow by generating severe congestion during the design routing phase.

SUMMARY OF THE INVENTION

The present invention concerns an apparatus comprising a plurality of input cells, two or more local tie up cells, and two or more local tie down cells. The plurality of input cells may be configured to provide (i) one or more gate voltage signals and (ii) one or more supply voltage signals. The two or more local tie up cells may be configured to provide electrostatic discharge (ESD) protection to one or more first standard cells. Each of the local tie up cells may be coupled to (i) the one or more first standard cells and (ii) each of the gate voltage signals. The two or more local tie down cells may be configured to provide ESD protection to one or more second standard cells. Each of the local tie down cells may be coupled to (i) the one or more second standard cells and (ii) each of the supply voltage signals.

The objects, features and advantages of the present invention include providing localized tie up and tie down cells that may (i) be connected to the VDD and the VSS net without destruction of the ESD buffer and/or (ii) avoid ESD damage on any input pin of a cell in a register transfer logic (RTL) netlist and/or a pre-layout gate level netlist.

BRIEF DESCRIPTION OF THE DRAWINGS

These and other objects, features and advantages of the present invention will be apparent from the following detailed description and the appended claims and drawings in which:

FIG. 1 is a block diagram of a conventional approach for cell connection of standard cells;

DETAILED DESCRIPTION OF THE PREFERRED EMBODIMENTS

Figure 2:
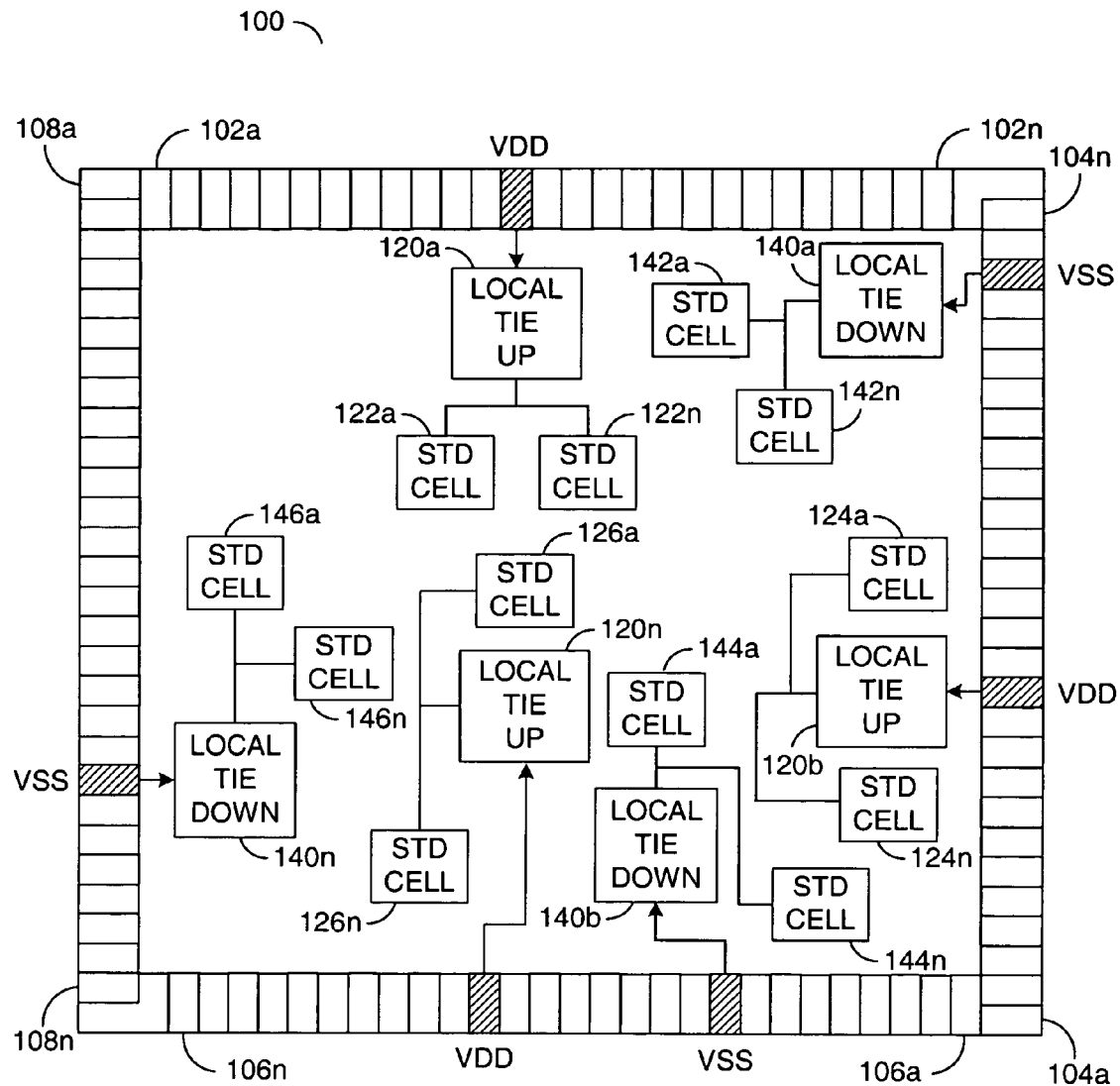
FIG. 2 is a block diagram of a preferred embodiment of the present invention.

Referring to FIG. 2, a block diagram of a system 100 is shown in accordance with a preferred embodiment of the present invention. The system 100 generally comprises a number of cells 102a-102n, a number of cells 104a-104n, a number of cells 106a-106n, a number of cells 108a-108n, a number of circuits 120a-120n, and a number of a number of circuits 122a-122n, a number of circuits 124a-124n, a number of circuits 126a-126n, a number of circuits 140a-140n, a number of circuits 142a-142n, a number of circuits 144a-144n and a number of circuits 146a-146n.

The circuit 100 may be implemented on a single integrated circuit package. The circuits 120a-120n may be implemented as local tie up cells. The circuits 122a-122n, the circuits 124a-124n, and the circuits 126a-126n may be implemented as standard cells. The circuits 140a-140n may be implemented as local tie down cells. The circuits 142a-142n, the circuits 144a-144n, and the circuits 146a-146n may be implemented as standard cells.

The local tie up cell 120a may be coupled to the standard cells 122a-122n. The local tie up cell 120b may be coupled to the standard cells 124a-124n. The local tie up cell 120n may be coupled to the standard cells 126a-126n. The local tie down cell 140a may be coupled to the standard cells 142a-142n. The local tie down cell 140b may be coupled to the standard cells 144a-144n. The local tie down cell 140n may be coupled to the standard cells 146a-146n. The standard cells may be implemented as transistors. The particular type of transistors used may be varied to meet the design criteria of a particular implementation.

The local tie up cells 120a-120n and the local tie down cells 140a-140n may be implemented as buffers (e.g., an electrostatic discharge (ESD) buffer and/or a decoupling buffer). The particular type of buffer implemented may be varied to meet the design criteria of a particular implementation. A voltage (e.g., VDD) may be applied to any one of the cells 102a-102n. The voltage VDD may be presented from a VDD net (not shown) to any one of the cells 102a-102n. The local tie up cell 120a may be coupled to one of the cells 102a-102n which provides the voltage VDD. In general, the local tie up cell 120a may buffer the voltage VDD prior to the passing the voltage VDD to the transistors 122a-122n. The voltage VDD may be received by the gate of the transistors 122a-122n. A voltage (e.g., VSS) may be applied to any one of a particular number of cells 102a-102n from a VCC net. The voltages VSS and VDD may be applied to one or more of the cells 102a-102n. The number of cells 102a-102n that may present the voltages VSS and VDD may be varied to meet the design criteria of a particular implementation.

The voltage VSS may be applied to any one of the cells 104a-104n. The local tie down cell 140a may be coupled to one of the cells 104a-104n that provides the voltage VSS. The local tie down cell 140a may buffer the voltage VSS prior to passing the voltage VSS to the transistors 142a-142n. The voltage VSS may be received by the gate of the transistors 142a-142n. The voltage VDD may also be applied to any one of the cells 104a-104n. The local tie up cell 120b may be coupled to one of the cells 104a-104n that provides the voltage VDD. The local tie up cell 120b may buffer the voltage VDD prior to passing the voltage VDD to the transistors 124a-124n. The voltage VDD may be received by one of the gates of the transistors 124a-124n. The voltages VSS and VDD may be applied to one or more of the cells 104a-104n. The number of cells 104a-104n that may present the voltages VDD and VSS may be varied to meet the design criteria of a particular implementation.

The voltage VSS may be applied to any one of a particular number of cells 106a-106n. The local tie down cell 140b may be coupled to one of the cells 106a-106n that provides the voltage VSS. The local tie down cell 140b may buffer the voltage VSS prior to passing the voltage VSS to the transistors 144a-144n. The voltage VSS may be received by the gate of one of the transistors 144a-144n. The voltage VDD may also be applied to one of the cells 106a-106n. The local tie up cell 120n may be coupled to one of the cells 106a-106n that provides the voltage VDD. The local tie up cell 120n may buffer the voltage VDD prior to passing the voltage VDD to the transistors 126a-126n. The voltage VDD may be received by one of the gates of the transistors 126a-126n. The voltages VSS and VDD may be applied to one or more of the cells 104a-104n. The number of cells 104a-104n that may present the voltages VDD and VSS may be varied to meet the design criteria of a particular implementation.

The voltage VSS may be applied to one of the cells 108a-108n. The local tie down cell 140n may be coupled to one of the cells 108a-108n that provides the voltage VSS. The local tie down cell 140n may buffer the voltage VSS prior to passing the voltage VSS to the transistors 146a-144n. The voltage VSS may be received by one of the gates of the transistors 146a-146n. The voltage VDD may be applied to any of the cells 108a-108n. The voltages VSS and VDD may be applied to one or more number of cells 102a-102n. The number of cells 102a-102n that may present the voltages VDD and VSS may be varied to meet the design criteria of a particular implementation.

Figure 3:
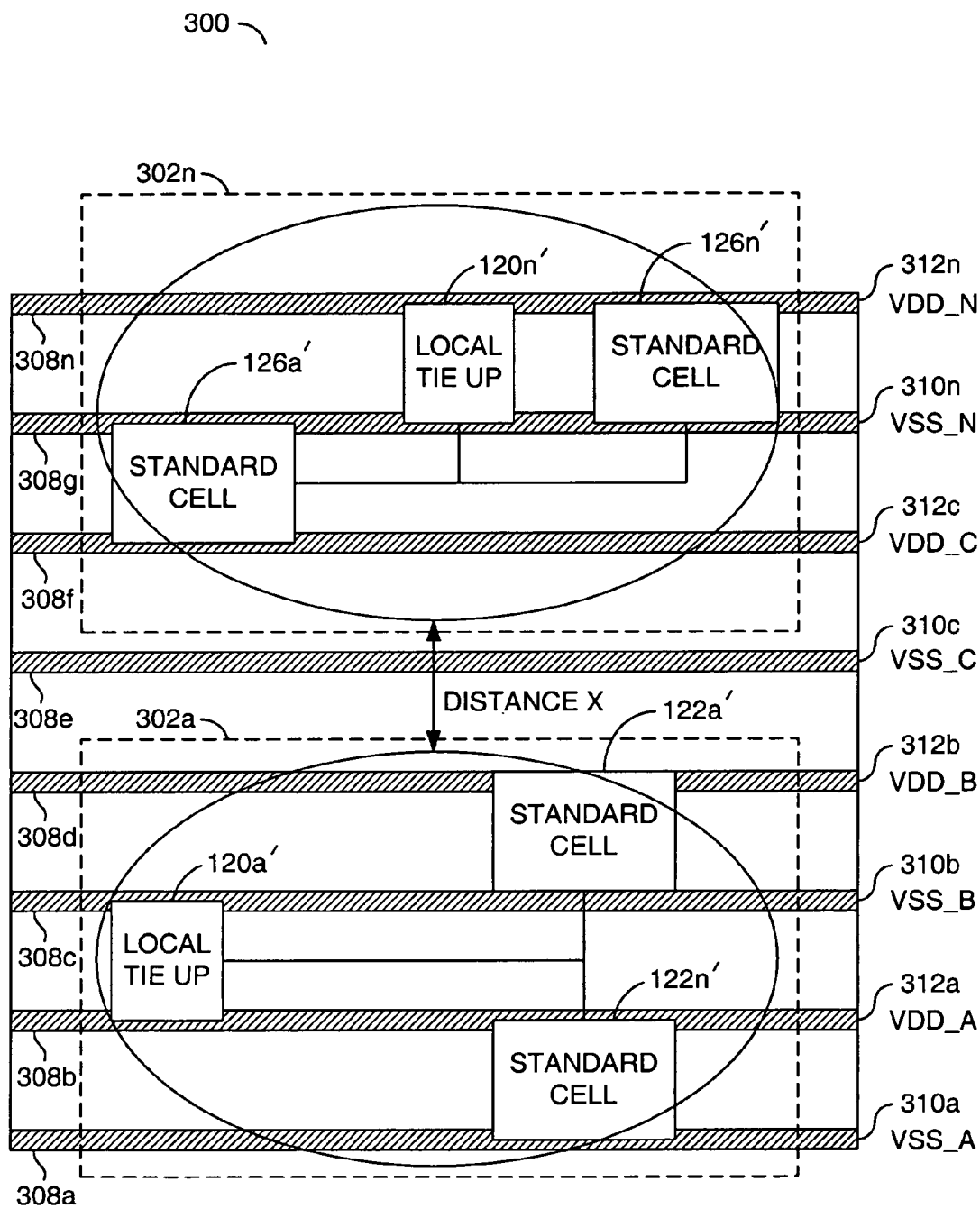
FIG. 3 is a detailed block diagram illustrating ESD protection on localized tie up nets.

Referring to FIG. 3, a block diagram of a circuit 300 illustrating ESD protection on local tie up nets is shown. The circuit 300 generally comprises a number of circuits 302a-302n and a number of standard cell rows 308a-308n. A number of circuits 302a-302n may be implemented as localized tie up nets. The circuit 300 may include local tie down nets (not shown) The standard cell rows 308a-308n may include power lines generally connected to a chip power mesh (not shown).

The tie up net 302a generally comprises a local tie up cell 120a' and a number of standard cells 122a'-122n'. The local tie up cell 120a' may be coupled to the standard cells 122a'-122n'. The tie up net 302n generally comprises a local tie up cell 120n' and a number of standard cells 126a'-126n'. The local tie up cell 120n' may be coupled to the standard cells 126a'-126n'.

A power supply (not shown) may present a plurality of voltages (VSS_A-VSS_N) to the circuit 300. A plurality of inputs 310a-310n may receive the voltages VSS_A-VSS_N. A power supply (not shown) may present a plurality of voltages (VDD_A-VDD_N) to the circuit 300. A plurality of inputs 312a-312n may receive the voltages VDD_A-VDD_N.

The circuit 302a may receive the voltage VDD_A on the input 312a. The tie up cell 120a' may receive the voltage VDD_A on the standard cell row 308b. The circuit 302n may receive the voltage VDD_N on the input 312n. The local tie up cell 120n' may receive the voltage VDD_N on the standard cell row 308n.

Generally, each of the voltages VSS_A-VSS_N are not equal in value due to various IR (current and resistance) drops across the circuit 300. Each of the voltages VDD_A-VDD_N are not equal in value due to various IR drops across the circuit 300. The voltage VDD_A in the area of the local tie up net 302a may be VDD_A+X, where X is a value given to compensate for the IR drop across the circuit 300. The voltage VDD_N in the area of the tie up net 302n may be VDD_N−Y, where Y is a value given to compensate for the IR drop across the circuit 300. Generally, the tie up net 302a may be separated from the tie up net 302n by a predetermined distance. If the circuits 302a and 302n were implemented as tie down nets, the circuits 302a and 302n may be separated by a predetermined distance.

In one example, the circuit 302a may be implemented as a tie up net and the circuit 302n may be implemented as a local tie down net. The circuits 302a and the circuit 302n may be separated by a predetermined distance. The predetermined distance between the circuits 302a and 302n may be varied to meet the design criteria of a particular implementation. For example, the predetermined distance may be varied to meet the specification of a particular technology. The change in voltage may also be varied to meet the design criteria of a particular implementation.

Figure 4:
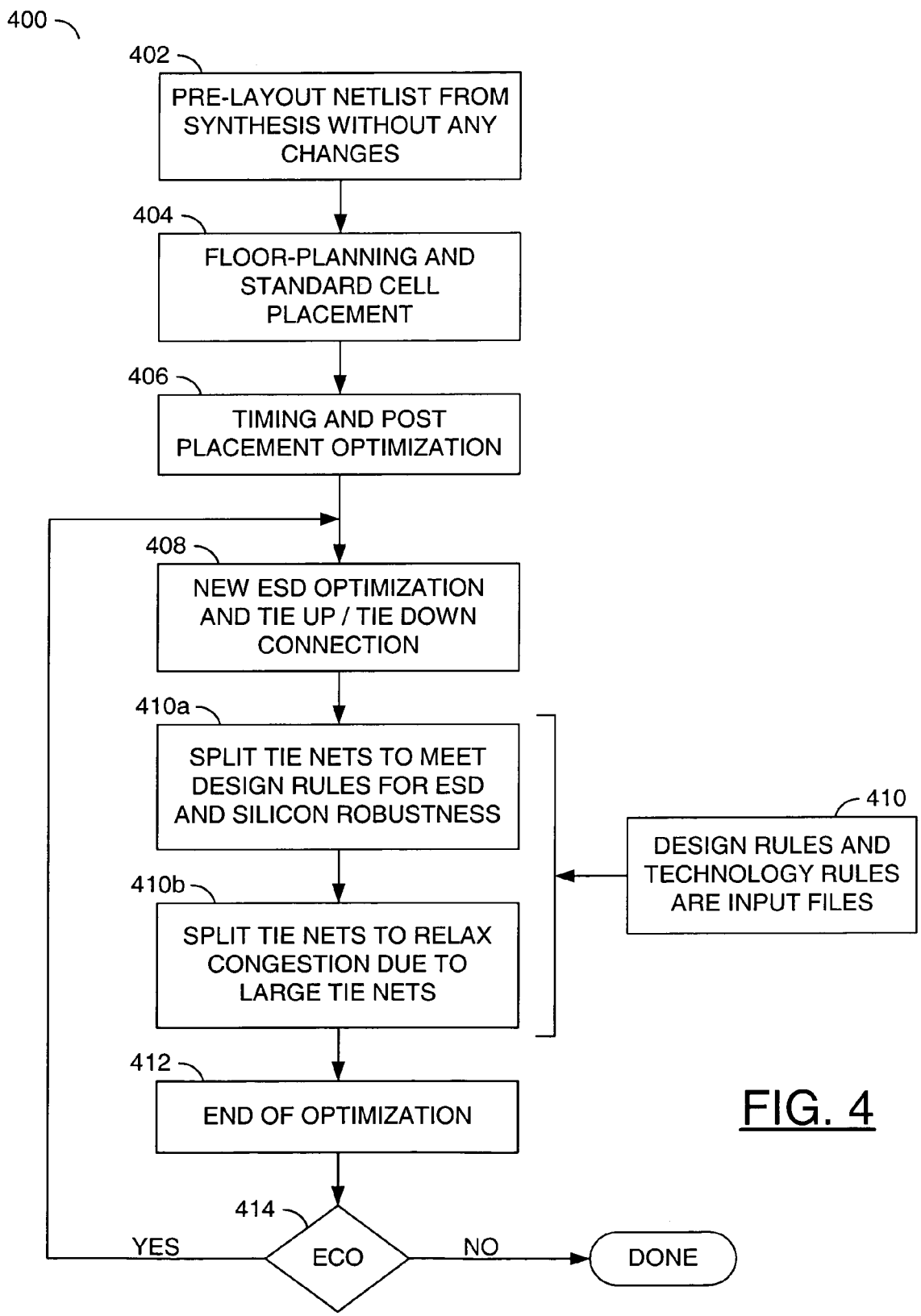
FIG. 4 is a flow chart illustrating ESD protection in accordance with the present invention.

Referring to FIG. 4, a method 400 for providing ESD protection is shown. The method 400 generally comprises a state 402, a state 404, a state 406, a state 408, a state 410, a state 412 and a decision state 414. The state 402 generally comprises determining a pre-layout netlist from synthesis without any changes. The state 404 generally comprises performing floor-planning and standard cell placement. The state 406 generally comprises determining timing and post placement optimization. The pre-layout netlist generated in the state 402 may be implemented into the cell placement of the state 404 and into the post placement optimization of state 406. The state 408 generally comprises implementing a new ESD optimization and tie up/tie down connection after the cell placement and the post optimization phase.

The new ESD optimization phase in the state 408 may perform an automatic insertion of the ESD protected tie up and/or tie down cells based on the placement of the logic cells. The gates of the transistors in a certain area may be connected to the local tie up and/or tie down cells (e.g., the ESD buffers). The method 400 may ensure that no other design rules are violated. The method 400 may also prevent large fan out nets in the design. A user may no longer need to be concerned with the placement of the standard cells and the connections to the local tie up cells and the local tie down cells.

The state 410 generally comprises implementing design rules and technology rules as input files. The state 410 generally comprises a substep 410*a* and a substep 410*b*. The substep 410*a* generally comprises splitting the tie up nets and/or the tie down nets. The tie up nets and the tie down nets are split to provide ESD protection and to ensure silicon robustness. The substep 410*b* generally comprises splitting the tie up nets and/or the tie down nets to relax congestion on the circuit 400 due to larger tie up nets and/or tie down nets. The state 412 generally comprises the end of the optimization. In the decision state 414, if an engineering change order (ECO) is submitted, then the method 400 moves to step 408. A new ESD optimization and tie up and tie down connection may be implemented, which may include the design changes requested in the ECO. If an ECO is not submitted, the method 400 is complete.

The method 400 may control different voltage values of the voltage VSS of the design due to IR drops. In general, the IR drop is a placement based effect because the IR drop is related to the distribution of the power mesh/supply. The method 400 may take different types of supply voltages into account. A designer may assign logic to 1'b0 or 1'b1. Generally, 1'b0 is a verilog syntax for a net tied to ground. The verilog syntax for a net tied to the voltage VDD is 1'b1. The ESD optimization phase in the state 408 may determine which ESD protected tie up and/or tie down domains are connected to the gate of the transistors.

The present invention may (i) eliminate high fanout nets implemented with the use of global tie up cells and global tie down cells, (ii) eliminate an ASIC designer's concerns with ESD protection of tied pins (iii) ensure the approach is correct by construction (iv) provide local tie up and local tie down cells instead of a global interconnect between local tie up and tie down cells to standard cells (v) eliminate IR drop (vi) ensure signal integrity and/or (vii) eliminate severe design closure issues.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a plurality of input cells on a single integrated circuit package each configured to provide (i) one or more gate voltage signals and (ii) one or more supply voltage signals;
   two or more local tie up cells each configured to provide electrostatic discharge (ESD) protection to one or more first standard cells, wherein each of said local tie up cells are coupled to (i) said one or more first standard cells and (ii) each of said gate voltage signals, wherein (i) each of said local tie up cells when coupled to said one or more first standard cells form a tie up net and (ii) each of said tie up nets are positioned a predetermined distance from each other; and
   two or more local tie down cells each configured to provide ESD protection to one or more second standard cells, wherein each of said local tie down cells are coupled to (i) said one or more second standard cells and (ii) each of said supply voltage signals.

2. The apparatus according to claim 1, wherein said local tie up cells each comprise an ESD buffer.

3. The apparatus according to claim 1, wherein said local tie down cells each comprise an ESD buffer.

4. The apparatus according to claim 1, wherein said first standard cell further comprises a transistor.

5. The apparatus according to claim 1, wherein said second standard cell further comprises a transistor.

6. The apparatus according to claim 1, further comprising:
   a plurality of standard cell rows configured to couple said local tie up cells to said gate voltage signals.

7. The apparatus according to claim 6, wherein said plurality of standard cell rows are configured to couple said local tie down cells to said supply voltage signals.

8. The apparatus according to claim 1, wherein each of said local tie down cells when coupled to said one or more second standard cells form a tie down net.

9. The apparatus according to claim 8, wherein each of said local tie down nets are positioned a predetermined distance from each other and each of said tie up net.

10. An apparatus comprising:
    means for providing (i) one or more gate voltage signals and (ii) one or more supply voltage signals;
    means for providing ESD protection to one or more first standard cells, wherein said means for providing ESD protection to said one or more first standard cells are coupled to (i) said one or more first standard cells and (ii) each of said gate voltage signals, wherein (i) each of a local tie up cells when coupled to said one or more first standard cells form a tie up net and (ii) each of said tie up nets are positioned a predetermined distance from each other; and
    means for providing ESD protection to one or more second standard cells, wherein said means for providing ESD protection to said one or more second standard cells are coupled to (i) said one or more second standard cells and (ii) each of said supply voltage signals.

11. A method comprising the steps of:
    (A) determining a pre-layout netlist from synthesis;
    (B) performing floor-planning and standard cell placement of a plurality of standard cells;
    (C) determining timing and post placement optimization;
    (D) implementing an ESD optimization to automatically insert one or more tie up nets and one or more tie down nets in response to the cell placement and post placement optimization of said plurality of standard; and (E) splitting said tie up nets and said tie down nets to meet design rules and technology rules related to ESD protection and silicon robustness.

12. The method according to claim 11, wherein step (E) further comprises:

further splitting larger tie up nets and larger tie down nets to relax congestion.

13. The method according to claim 11, wherein step (E) further comprises:

inserting said design rules and said technology rules as input files.

14. The method according to claim 11, wherein said method further comprises:

performing a new ESD optimization to automatically insert said one or more tie up nets and said one or more tie down nets if an engineering change order has been submitted.

15. The method according to claim 14, wherein said method further comprises:

completing said ESD optimization if said engineering change order has not been submitted.

16. The method according to claim 11, wherein step (D) further comprises the step of:

coupling said plurality of standard cells to one or more tie up nets or one or more tie down nets.

17. The method according to claim 11, further comprising:

coupling one or more gates of one or more transistors to said one or more tie up nets or said one or more tie down nets.

\* \* \* \* \*